United States Patent [19]

Feyfant et al.

[11] Patent Number: 6,134,429
[45] Date of Patent: Oct. 17, 2000

[54] DIRECT DIGITAL DOWN CONVERSION OF A 10.8 MHZ INTERMEDIATE FREQUENCY SIGNAL IN THE PERSONAL HANDY PHONE SYSTEM

[75] Inventors: Patrick Feyfant, Roulon; Laurent Winckel, Antibes; Satoshi Yoshida, Nice; Philippe Gaglione, Mandelieu; Varenka Martin, Antibes; Oliver Weigelt, Antibes; Denis Archambaud, Antibes, all of France

[73] Assignee: VLSI Technology, Inc., San Jose, Calif.

[21] Appl. No.: 09/058,611

[22] Filed: Apr. 10, 1998

[51] Int. Cl.$^7$ .................................................. H04Q 7/32
[52] U.S. Cl. .......................................... 455/324; 455/313
[58] Field of Search ................................... 455/550, 324, 455/313, 314, 315, 205, 210, 296; 375/316, 355, 340, 376, 261, 142, 150

[56] References Cited

U.S. PATENT DOCUMENTS

| Re. 36,388 | 11/1999 | Fox et al. | 708/276 |
|---|---|---|---|
| 4,893,316 | 1/1990 | Janc et al. | 341/110 |
| 5,515,364 | 5/1996 | Fague | 455/83 |
| 5,579,341 | 11/1996 | Smith et al. | 455/103 |
| 5,630,227 | 5/1997 | Bella et al. | 455/324 |
| 5,812,591 | 9/1998 | Shumaker et al. | 375/206 |
| 5,937,013 | 8/1999 | Lam et al. | 375/340 |
| 5,949,764 | 9/1999 | Yoshida et al. | 455/416 |
| 5,953,643 | 9/1999 | Speake et al. | 455/324 |
| 5,999,561 | 12/1999 | Naden et al. | 375/142 |

OTHER PUBLICATIONS

Association of Radio Industries and Businesses (ARIB), *Personal Handy Phone System ARIB Standard*, Version 2, Dec. 26, 1995.

Ministry of Posts and Telecommunications, Consulting Company, PHS services Providers, Manufactures, "*Personal Handy–Phone System (PHS) Guidebook*" Jul. 1995, Ministry of Posts & Telecommunications, Japan.

*Primary Examiner*—William G. Trost
*Assistant Examiner*—Jean Allard Gelin
*Attorney, Agent, or Firm*—Wagner, Murabito & Hao LLP

[57] ABSTRACT

A system for a direct digital down conversion of a 10.8 MHz intermediate frequency signal in the personal handy phone system. The present invention includes a system that enables a direct digital down conversion of a 10.8 MHz intermediate frequency signal into a digital baseband signal within cell stations and portable stations of the personal handy phone system. To perform this direct digital down conversion of a 10.8 MHz intermediate frequency signal, one embodiment of the present invention uses a hard limiter circuit, a sampler circuit and a digital down converter circuit. The hard limiter circuit of the present invention receives a 10.8 MHz intermediate frequency signal, utilized within cell stations and portable station of the personal handy phone system, and provides a threshold for it. The sampler circuit uses a 19.2 MHz oscillating clock signal to sample the intermediate frequency signal that is output from the hard limiter circuit. Due to spectral leakage, the 10.8 MHz intermediate frequency signal that was input into the sampler circuit is output as an 8.4 MHz intermediate frequency signal. The digital down converter circuit uses an 8.4 MHz signal to perform a digital down conversion of the 8.4 MHz intermediate frequency signal into a digital baseband signal. The present invention provides a system that utilizes only one digital down conversion stage to perform a direct digital down conversion of a 10.8 MHz intermediate frequency signal into a digital baseband signal.

20 Claims, 3 Drawing Sheets

DIRECT DIGITAL DOWN CONVERSION OF A 10.8 MHZ INTERMEDIATE FREQUENCY SIGNAL IN THE PERSONAL HANDY PHONE SYSTEM

TECHNICAL FIELD

The present invention relates to the field of wireless telecommunications. More specifically, the present invention relates to providing direct digital down conversion of an intermediate frequency signal into a digital baseband signal within portable stations and cell stations of the personal handy phone system.

BACKGROUND ART

Within the field of wireless telecommunications systems there exists a system referred to as the personal handy phone system, otherwise known as PHS. Within the personal handy phone system, a user of a portable or personal station is able to communicate with a user of another telecommunication device by way of a cell station by way of a wireless communication channel. To enable portable stations and cell stations to communicate with each other within the personal handy phone system a radio interface is utilized.

The radio interface of the personal handy phone system utilizes a 1.9 gigahertz (GHz) carrier frequency to transmit information between cell stations and portable stations by way of the wireless communication channel. The antennas of the portable stations and the cell stations receive this carrier frequency signal and provide it to a radio chip. The radio chip amplifies the received carrier frequency signal and then down converts the amplified signal into a 10.8 megahertz (MHz) intermediate frequency signal. The 10.8 MHz intermediate frequency signal is then digitally down converted into a digital baseband signal which is provided to the upper layer of protocol within the particular device (e.g., cell station or portable station) that initially received the 10.8 MHz intermediate frequency signal. The manner in which the 10.8 MHz intermediate frequency signal is digitally down converted into a digital baseband signal conventionally is discussed below.

FIG. 1 illustrates a block diagram of the components that are conventionally used within the personal handy phone system to digitally down convert a 10.8 MHz intermediate frequency signal 120 into a digital baseband signal 130. The 10.8 MHz intermediate frequency signal 120 of the personal handy phone system contains communication information which could include voice/sound data or other types of communication data. Within a conventional digital down conversion circuit 100, a 10.8 MHz intermediate frequency signal 120 is received by hard limiter 102 which provides a threshold for the intermediate frequency signal 120. Sampler 104 receives the intermediate frequency signal from hard limiter 102 and samples it with a 19.2 MHz clock signal. The 19.2 MHz clock signal is a standard frequency used within baseband chips of the personal handy phone system because it is an integral multiple of the symbol frequency. The symbol frequency is 192 kilobits per second for a great majority of the baseband systems of the personal handy phone system. Down converter 106 receives the resulting intermediate frequency signal from sampler 104 and digitally down converts it by mixing it with a 9.6 MHz clock signal. Down converter 108 receives the resulting intermediate frequency signal from down converter 106. Down converter 108 further digitally down converts the intermediate frequency signal by multiplying it by a 1.2 MHz signal produced by local oscillator 110 resulting in a digital baseband signal 130. The resulting digital baseband signal 130 is a 384 kilobits per second signal which is then transferred to the upper layer of protocol within the particular device (e.g., portable station and cell station) that initially received the 10.8 MHz intermediate frequency signal 120.

The problem with the prior art digital down conversion of a 10.8 MHz intermediate frequency signal into a digital baseband signal within the personal handy phone system is that it requires two digital down conversion stages (e.g., down converters 106 and 108). As such, the two digital down conversion stages necessitate more internal circuitry within the portable stations and cell stations of the personal handy phone system increasing system complexity, time to manufacture and product cost. Therefore, it would be advantageous to provide a system within the personal handy phone system that enables a 10.8 MHz intermediate frequency to be digitally down converted into a digital baseband signal using one digital down conversion stage. Further, it would be advantageous to provide such a system that utilizes the personal handy phone system standard frequency of 19.2 MHz, which is an integral multiple of the symbol frequency of 192 kilobits per second. The present invention provides this advantage.

DISCLOSURE OF THE INVENTION

The present invention includes a system that enables a direct digital down conversion of a 10.8 MHz intermediate frequency signal into a digital baseband signal within cell stations and portable stations of the personal handy phone system using the standard 19.2 MHz signal. To perform this direct digital down conversion of a 10.8 MHz intermediate frequency signal, the present invention uses a hard limiter circuit, a sampler circuit and a digital down converter circuit. The hard limiter circuit of the present invention receives a 10.8 MHz intermediate frequency signal that is utilized within cell stations and portable station of the personal handy phone system and provides a threshold for it. The sampler circuit uses an oscillating clock signal to sample the intermediate frequency signal that is output from the hard limiter circuit. According to the present invention, due to spectral leakage, the 10.8 MHz intermediate frequency signal that was input into the sampler circuit is output as an 8.4 MHz intermediate frequency signal. The digital down converter circuit uses an 8.4 MHz signal to perform a digital down conversion of the 8.4 MHz intermediate frequency signal into a digital baseband signal. Therefore, the present invention advantageously provides a system that utilizes only one digital down conversion stage to perform a direct digital down conversion of a 10.8 MHz intermediate frequency signal into a digital baseband signal.

Specifically, within one embodiment of the present invention a 10.8 MHz intermediate frequency signal is received by a hard limiter circuit. The hard limiter circuit provides a threshold for the received 10.8 MHz intermediate frequency signal by designating a value of one for the signal if it is greater than zero volts and a value of zero for the signal if it is lower than zero volts. The resulting output signal of the hard limiter circuit is a 10.8 MHz intermediate frequency signal. A sampler circuit receives the output intermediate frequency signal from the hard limiter circuit and samples it with a 19.2 MHz clock signal which is a standard frequency within the personal handy phone system.

Due to spectral leakage, the resulting output signal of the sampler circuit is a 8.4 MHz intermediate frequency signal which contains the same characteristics as the 10.8 MHz intermediate frequency signal which was received by the sampler circuit. The 8.4 MHz intermediate frequency signal output from the sampler circuit is received by a digital down converter circuit. The digital down converter circuit performs a digital down conversion of the 8.4 MHz intermediate frequency signal by multiplying it by a 8.4 MHz signal, produced by a local oscillator, resulting in a digital baseband signal of 384 kilobits per second. The resulting digital baseband signal is then transferred to the upper layer of protocol within the device (e.g., cell station or portable station) that initially received the 10.8 MHz intermediate frequency signal.

BRIEF DESCRIPTION OF THE DRAWINGS

The accompanying drawings, which are incorporated in and form a part of this specification, illustrate embodiments of the invention and, together with the description, serve to explain the principles of the invention.

BEST MODE FOR CARRYING OUT THE INVENTION

In the following detailed description of the present invention, a system for a direct digital down conversion of a 10.8 MHz intermediate frequency signal within the personal handy phone system using a standard 19.2 MHz signal, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

The present invention operates within the personal handy phone system which provides wireless voice communication for its users. Along with providing its users wireless voice communication, the personal handy phone system also provides facsimile and multimedia communication capabilities. The personal handy phone system has the ability to operate both indoors and outdoors, which offers greater communication opportunities. For instance, the indoor operations include using it within office spaces, homes, hotels, shopping malls and airports. Furthermore, the outdoor operations of the personal handy phone system include using it within rural, suburban, and city areas. The personal handy phone system specification is well known by those skilled in the art, and is discussed in a number of publications, such as *Personal Handy-Phone System (PHS) Guidebook* by the Ministry of Posts & Telecommunications, Japan (1995) and *Personal Handy Phone System ARIB Standard Version* 2 by the Association of Radio Industries and Businesses, (1995).

Figure 1:
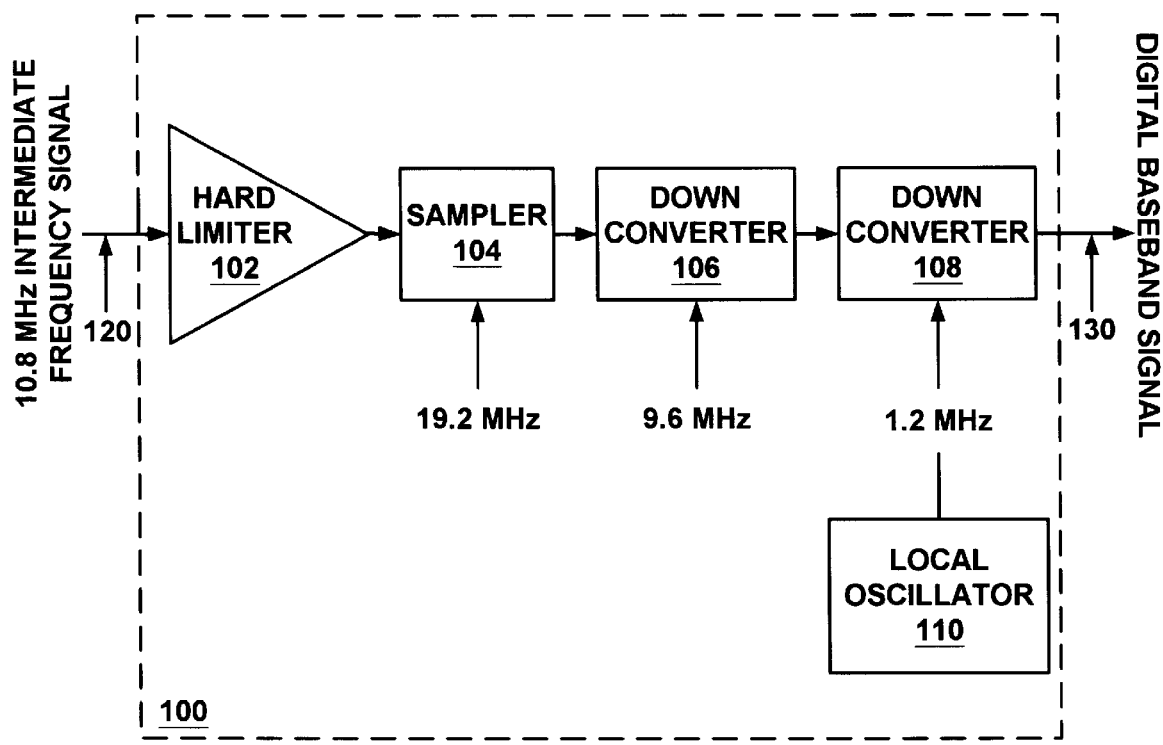
FIG. 1 illustrates a block diagram of a prior art system used within the personal handy phone system to digitally down convert a 10.8 MHz intermediate frequency signal into a digital baseband signal.
Figure 2:
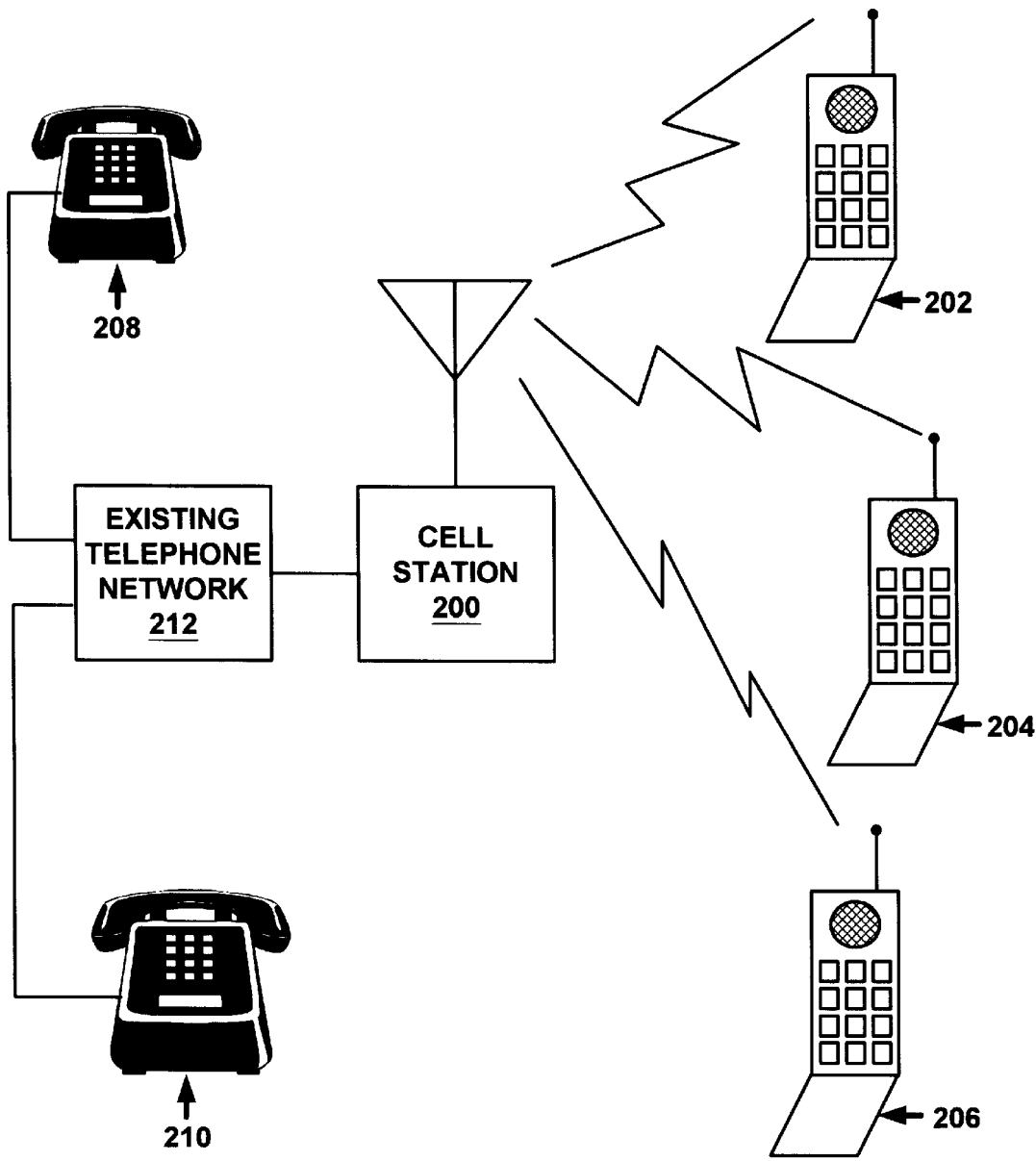
FIG. 2 illustrates a general overview of the personal handy phone system in which the present invention operates.

FIG. 2 illustrates a general overview of the personal handy phone system 250 in which the present invention operates. The two main transmitter/receiver components that comprise the personal handy phone system are a cell station and a portable station. The peripheral circuitry of the present invention is implemented within the internal circuitry of the portable station and the cell station. Referring to FIG. 2, portable stations 202–206 are similar in function to cordless telephone handsets and have the ability to transmit and receive voice information along with other types of data. Cell station 200 is a transmitter/receiver base station which can be implement by coupling it into the existing public telephone network 212. Implemented in this way, cell station 200 enables the users of portable stations 202–206 to communicate with each other and with the users of land line based telephones 208 and 210 which are coupled by wire to the existing public telephone network 212. The information (e.g., sound/voice data) that is communicated between cell station 200 and portable stations 202–206 in personal handy phone system 250 is the same type of information that can normally be transferred and received over a public telephone wire network system. But instead of communicating over a wire network, the personal handy phone system uses a wireless digital radio interface as defined in the above referenced personal handy phone system specification to communicate information between cell station 200 and portable stations 202–206. One present invention embodiment of the digital radio interface used by the personal handy phone system 250 is a time division multiple access capability with time division duplexing (TDMA-TDD).

The radio interface of the personal handy phone system 250 utilizes a 1.9 gigahertz (GHz) carrier frequency to transmit information between cell station 200 and portable stations 202–206. The antennas of portable stations 202–206 and cell station 200 receive this carrier frequency signal and input it into an internal radio chip that is located within the transmitter/receiver device that initially received the carrier frequency signal. The internal radio chip amplifies the received carrier frequency signal and then down converts it into a 10.8 MHz intermediate frequency signal. The present invention provides a system for direct digital down conversion of the 10.8 MHz intermediate frequency signal into a digital baseband signal within cell station 200 and portable stations 202–206 of the personal handy phone system 250 without using two down converter stages as done in the prior art. The present invention also performs the above feature using the personal handy phone system standard sample frequency of 19.2 MHz.

Figure 3:
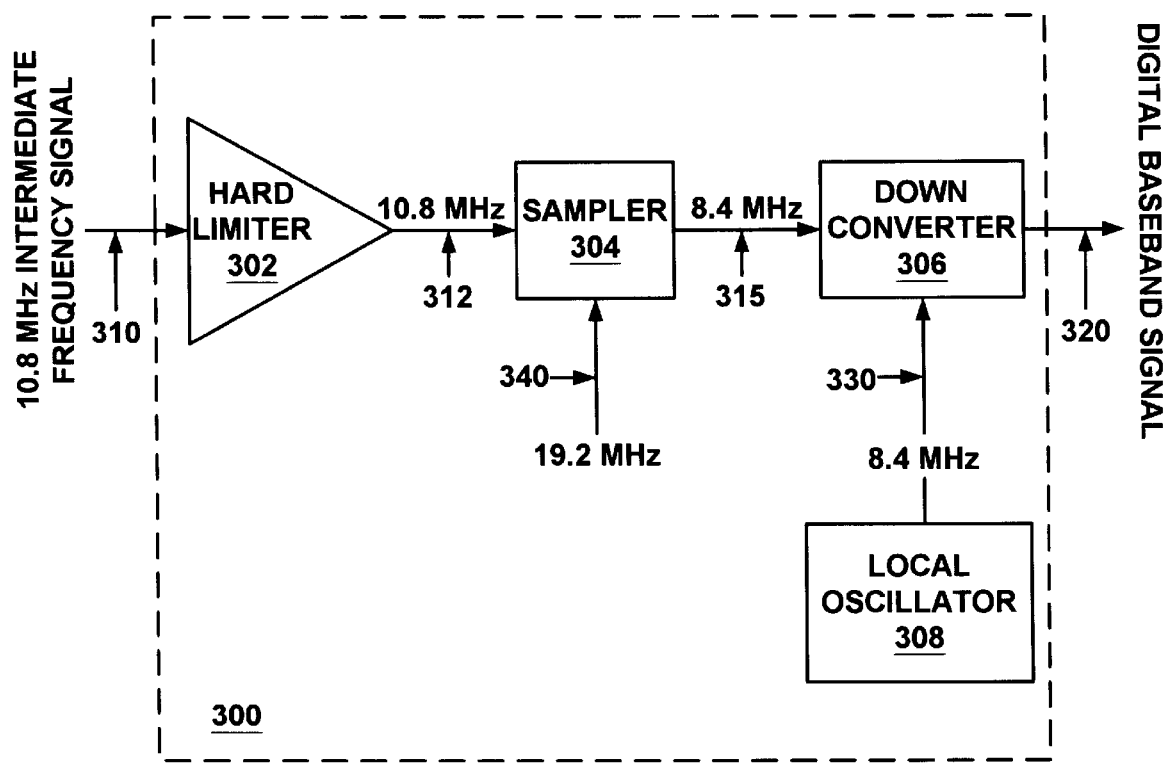
FIG. 3 illustrates a block diagram of the components used within one embodiment of the present invention within the personal handy phone system to perform a direct digital down conversion of a 10.8 MHz intermediate frequency signal into a digital baseband signal.

FIG. 3 illustrates a block diagram of the components used within one embodiment of the present invention system 300 to perform a direct digital down conversion of a 10.8 MHz intermediate frequency signal 310 into a digital baseband signal 320. Within the present invention embodiment of circuit 300, a 10.8 MHz intermediate frequency signal 310 is received by hard limiter circuit 302. Hard limiter circuit 302 provides a threshold for the 10.8 MHz intermediate frequency signal by designating a value of one to the signal if it is greater than a threshold voltage and a value of zero to the signal if it is lower than the threshold voltage. In one embodiment, the threshold voltage is zero volts. The resulting output signal 312 of hard limiter circuit 302 is a 10.8 MHz intermediate frequency signal that has been hard limited. Sampler circuit 304 receives the output intermediate frequency signal 312 from hard limiter circuit 302 and samples it with the personal handy phone system standard 19.2 MHz clock signal 340. The 19.2 MHz clock signal 340 is a standard frequency used within baseband chips because it is an integral multiple of the symbol frequency, which is 192 kilobits per second for a great majority of baseband systems of the personal handy phone system. It is therefore advantageous to utilize the personal handy phone system standard 19.2 MHz clock signal. It is important to point out that because of spectral leakage the present invention is able to digitally down convert intermediate frequency signal 312 using only one down conversion stage, even though clock signal 340 is not twice the frequency of sampled signal 312.

Due to spectral leakage of sampler circuit 304, the 10.8 MHz intermediate frequency signal 310 that was input into sampler circuit 304 of FIG. 3 is output from the sampler circuit 304 as an 8.4 MHz intermediate frequency signal 315. The output 8.4 MHz intermediate frequency signal 315 has the same characteristics as the 10.8 MHz intermediate frequency signal 312 which was received by sampler circuit 304. The 8.4 MHz intermediate frequency signal 315 output from sampler circuit 304 is received by down converter circuit 306. Down converter circuit 306 performs a digital down conversion of the 8.4 MHz intermediate frequency signal 315 by multiplying it by an 8.4 MHz signal, produced by local oscillator circuit 308, resulting in a digital baseband signal 320 which is a 384 kilobits per second signal. Digital baseband signal 320 is a digital recovered signal that contains communication information (e.g., voice/sound data) digitally as transistor-transistor logic (TTL) pulses. The resulting digital baseband signal 320 is then transferred to the digital upper layer including one or more digital signal processors of protocol within the device (e.g., cell station or portable station) that initially received the 10.8 MHz intermediate frequency signal 310. As described above, the present invention makes use of the above referenced spectral leakage to provide a system that utilizes only one digital down conversion stage to perform a direct digital down conversion of a 10.8 MHz intermediate frequency signal 310 into a digital baseband signal 320 within the personal handy phone system 250.

Due to spectral leakage, under the arrangement of FIG. 3, the intermediate frequency signal 310 at 10.8 MHz is sampled at 19.2 MHz to create a signal 315 (at 8.4 MHz) that can be down converted by the 8.4 MHz signal 330. Therefore the frequency 340 does not have to be twice the frequency of the sampled signal 312.

With reference to FIG. 3, one present invention embodiment of local oscillator circuit 308 is a numerically controlled oscillator. One embodiment of the numerically controlled oscillator is implemented within the present invention by utilizing a read only memory unit (e.g., ROM) that contains samples of the oscillating 19.2 MHz clock signal. The ROM is addressed by a counter that continuously increments from the first address to the last address of the ROM to create the illusion of an oscillator.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A direct digital down conversion circuit utilized within a portable station and a cell station of a personal handy phone system, said circuit comprising:

a hard limiter circuit coupled to receive an intermediate frequency input signal of a first frequency and utilized within said personal handy phone system, said hard limiter circuit for generating a second signal based on said intermediate frequency input signal, said second signal comprising pulses of a first and a second state and of said first frequency;

a sampler circuit coupled to receive said second signal from said hard limiter circuit, said sampler circuit for sampling said second signal using a 19.2 MHz frequency signal and for generating a third signal of a second frequency that is lower than said first frequency; and a single digital down converter circuit coupled to receive said third signal output from said sampler circuit, said digital down converter circuit for using a fourth signal of said second frequency to convert said third signal from said sampler circuit into a digital baseband signal, and wherein said sampler circuit and said digital down converter circuit utilize spectral leakage to generate said digital baseband signal from said intermediate frequency input signal and wherein said intermediate frequency input signal is more than one half the frequency of said 19.2 MHz signal.

2. A direct digital down conversion circuit as described in claim 1 further comprising a local oscillator for generating said fourth signal.

3. A direct digital down conversion circuit as described in claim 2 wherein said local oscillator is a numerically controlled oscillator.

4. A direct digital down conversion circuit as described in claim 1 wherein said intermediate frequency input signal utilized with said personal handy phone system is a 10.8 megahertz intermediate frequency signal.

5. A direct digital down conversion circuit as described in claim 4 wherein said third signal is an 8.4 megahertz signal.

6. A direct digital down conversion circuit as described in claim 1 wherein said third signal is an 8.4 megahertz signal.

7. A direct digital down conversion circuit as described in claim 1 wherein said digital baseband signal is a 384 kilobits per second signal.

8. A direct digital down conversion circuit as described in claim 5 wherein said digital baseband signal is a 384 kilobits per second signal.

9. A direct digital down conversion circuit utilized within a portable station and a cell station of a personal handy phone system, said circuit comprising:

a hard limiter circuit coupled to receive an intermediate frequency input signal of 10.8 MHz and utilized within said personal handy phone system, said hard limiter circuit for generating a second signal based on said intermediate frequency input signal, said second signal comprising pulses of a first and a second state and of 10.8 MHz;

a sampler circuit coupled to receive said second signal from said hard limiter circuit, said sampler circuit for sampling said second signal using a 19.2 MHz frequency signal and for generating a third signal of a first frequency that is lower than 10.8 MHz; and a single digital down converter circuit coupled to receive said third signal output from said sampler circuit, said digital down converter circuit for using a fourth signal of said first frequency to convert said third signal from said sampler circuit into a digital baseband signal, and wherein said sampler circuit and said digital down converter circuit utilize spectral leakage to generate said digital baseband signal from said intermediate frequency input signal and wherein said intermediate frequency input signal is more than one half the frequency of said 19.2 MHz signal.

10. A direct digital down conversion circuit as described in claim 9 further comprising a local oscillator for generating said fourth signal.

11. A direct digital down conversion circuit as described in claim 10 wherein said local oscillator is a numerically controlled oscillator.

12. A direct digital down conversion circuit as described in claim 10 wherein said third signal is an 8.4 megahertz signal.

13. A direct digital down conversion circuit as described in claim 10 wherein said digital baseband signal is a 384 kilobits per second signal.

14. A method of direct digital down conversion within a portable station and a cell station of a personal handy phone system, said method comprising the steps of:

using a hard limiter circuit to receive an intermediate frequency input signal of a first frequency that is utilized by said personal handy phone system and to generate a second signal based thereon, said second signal comprising pulses of a first and a second state and of said first frequency;

using a sampler circuit that is coupled to receive said second signal from said hard limiter circuit to sample said second signal using a 19.2 MHz frequency signal and to generate a third signal of a second frequency that is lower than said first frequency; and using a single digital down converter circuit to receive said third signal output from said sampler circuit, and using a fourth signal of said second frequency, also to convert said third signal from said sampler circuit into a digital baseband signal, and wherein said sampler circuit and said digital down converter circuit utilize spectral leakage to generate said digital baseband signal from said intermediate frequency input signal wherein said intermediate frequency input signal is more than one half the frequency of said 19.2 MHz signal.

15. A method as described in claim 14 further comprising the step of generating said fourth signal using a local oscillator.

16. A method as described in claim 15 wherein said local oscillator is a numerically controlled oscillator.

17. A method as described in claim 14 wherein said intermediate frequency input signal utilized with said personal handy phone system is a 10.8 megahertz intermediate frequency signal.

18. A method as described in claim 17 wherein said third signal is an 8.4 megahertz signal.

19. A method as described in claim 15 wherein said third signal is an 8.4 megahertz signal.

20. A method as described in claim 14 wherein said digital baseband signal is a 384 kilobits per second signal.

* * * * *